United States Patent
Noguchi

(12) 
(10) Patent No.: US 7,548,131 B2
(45) Date of Patent: Jun. 16, 2009

(54) OSCILLATION CIRCUIT WITH TEMPERATURE-DEPENDENT CURRENT SOURCE

(75) Inventor: Mineo Noguchi, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 196 days.

(21) Appl. No.: 11/754,409

(22) Filed: May 29, 2007

(65) Prior Publication Data

US 2008/0084249 A1  Apr. 10, 2008

(30) Foreign Application Priority Data

Oct. 5, 2006  (JP) .............................. 2006-273643

(51) Int. Cl.
*H03K 3/0231*  (2006.01)
(52) U.S. Cl. ....................................... 331/176; 331/111
(58) Field of Classification Search ................. 331/176, 331/111, 143, 66
See application file for complete search history.

(56) References Cited

U.S. PATENT DOCUMENTS

| 4,868,525 | A | * | 9/1989 | Dias ........................... 331/111 |
| 5,072,197 | A |   | 12/1991 | Anderson |
| 6,356,161 | B1 | * | 3/2002 | Nolan et al. ................. 331/176 |
| 6,695,475 | B2 |   | 2/2004 | Yin |
| 2004/0012449 | A1 |   | 1/2004 | Illegems |

FOREIGN PATENT DOCUMENTS

| JP | 4304708 | 10/1992 |
| JP | 6177719 | 6/1994 |
| JP | 7038348 | 2/1995 |
| JP | 9186294 | 7/1997 |
| JP | 11120782 | 4/1999 |
| JP | 2001068976 | 3/2001 |
| JP | 2003-4547 | 1/2003 |
| JP | 2003283306 | 10/2003 |
| JP | 2005-533443 | 11/2005 |

* cited by examiner

*Primary Examiner*—Joseph Chang
(74) *Attorney, Agent, or Firm*—Volentine & Whitt, P.L.L.C.

(57) ABSTRACT

An output signal ZA of NAND 48a is given to a first input of NAND 48b and is given to a second input of the above NAND 48b, simultaneously through a delay circuit. Furthermore, an output signal ZB of the NAND 48b is given to the first input of NAND 48a and is given to the second input of NAND 48a, simultaneously through a delay circuit. The delay circuit includes a charging and discharging circuit consisting of a NMOS 42 having the conductivity controlled by a voltage VN depending on a temperature signal from a temperature-dependent current source 30 and a capacitor 44, and a NMOS 45 being turned on/off by the voltage of the above capacitor 44. By setting temperature characteristics of the voltage VN and temperature characteristics of the threshold voltage of the NMOS 45 so as to cancel each other, the oscillation frequency variation of the oscillation circuit consisting of astable multivibrators can be restrained.

5 Claims, 4 Drawing Sheets

An oscillation circuit according to first embodiment of the invention

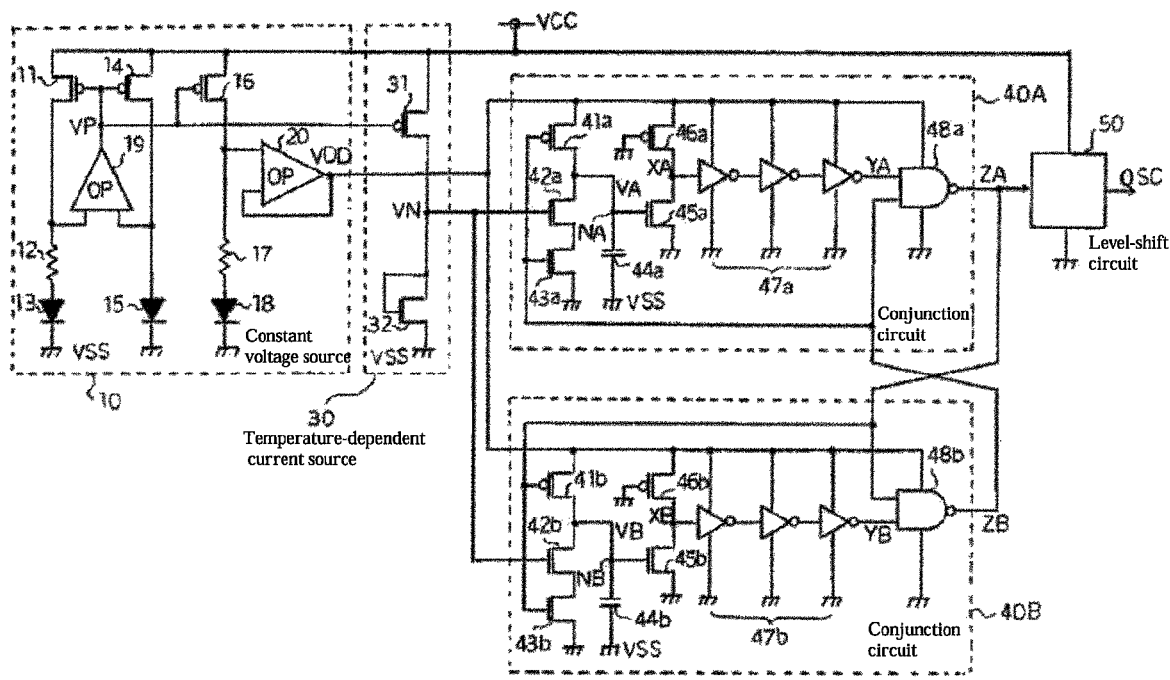
Fig. 1 An oscillation circuit according to first embodiment of the invention

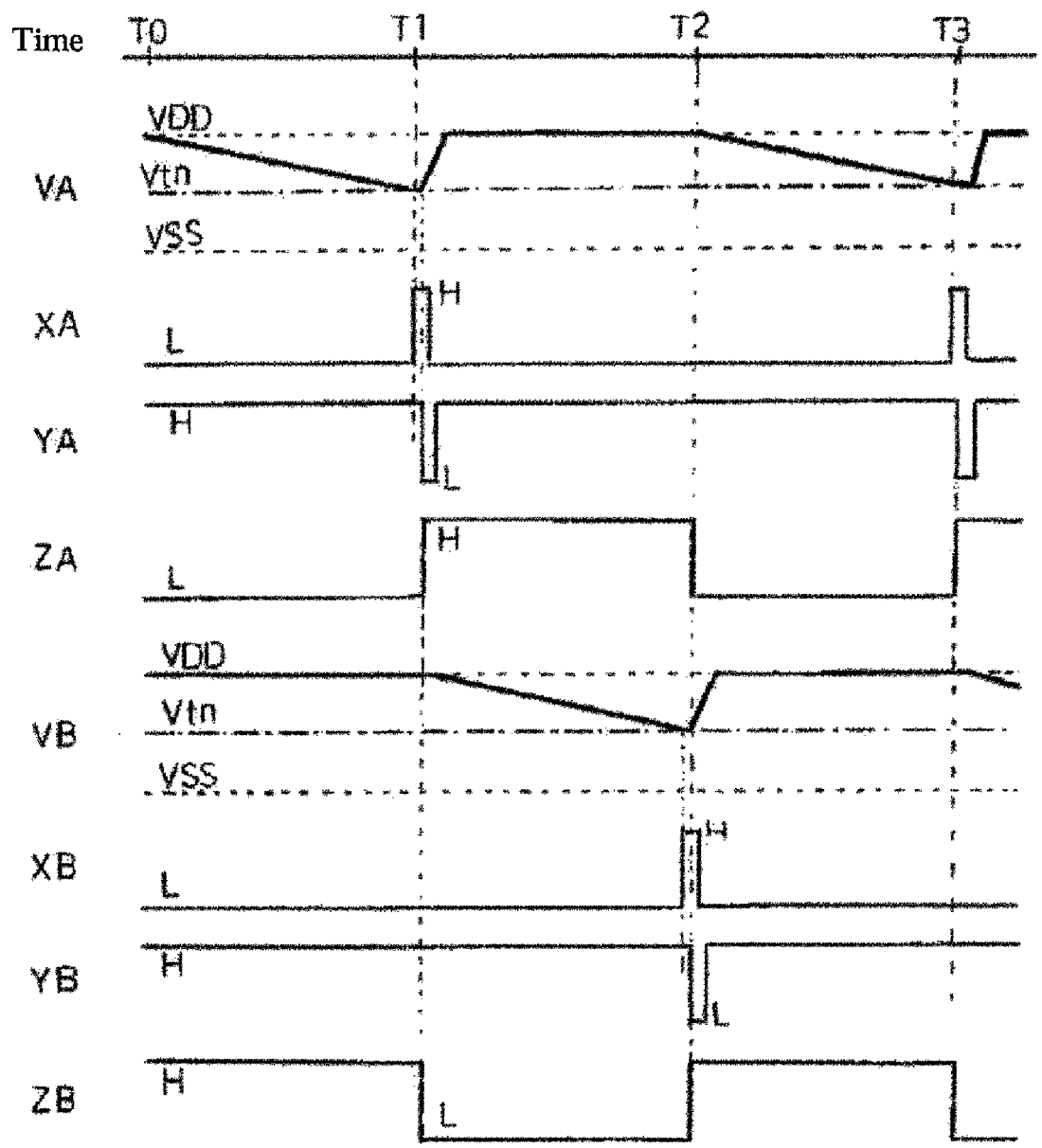
Fig. 2 Signal waveforms of Fig.1

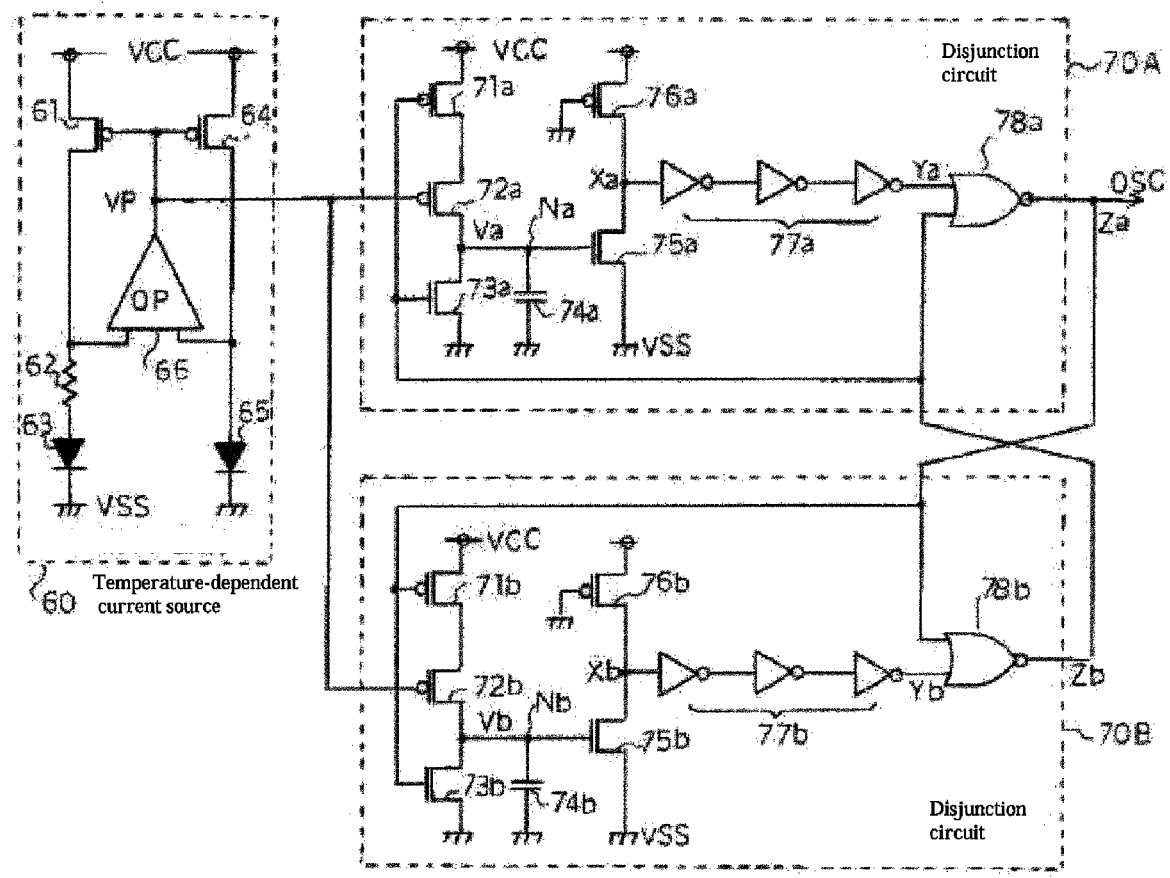
Fig. 3 An oscillation circuit according to second embodiment of the invention

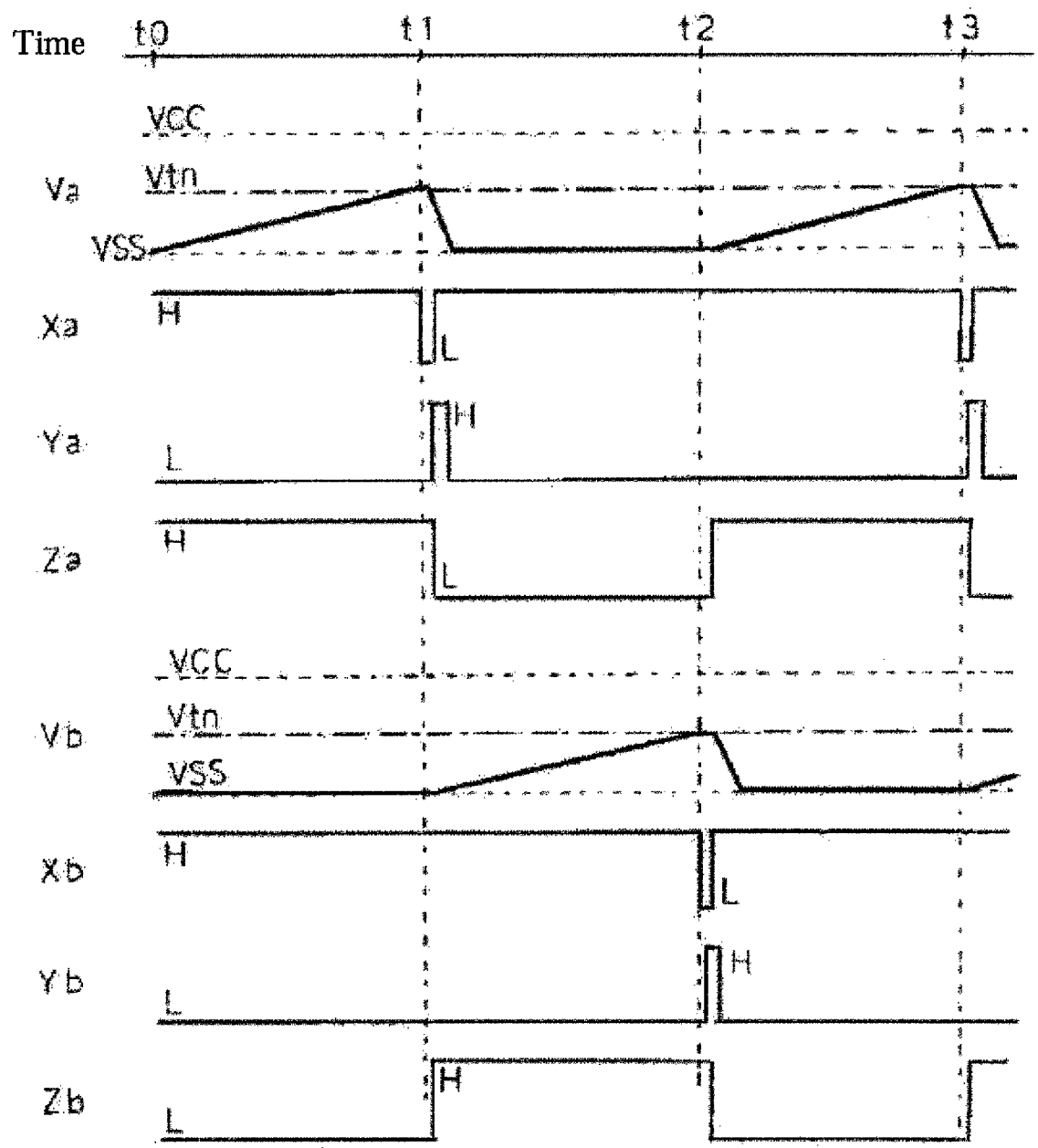
Fig. 4 Signal waveforms of Fig.3

OSCILLATION CIRCUIT WITH TEMPERATURE-DEPENDENT CURRENT SOURCE

BACKGROUND OF THE INVENTION

1. Field of the Invention

The present invention relates to an oscillation circuit having smaller oscillation frequency variation caused by power supply voltages or ambient temperatures.

This is a counterpart of Japanese patent application Serial Number 273643/2006, filed on Oct. 5, 2006, the subject matter of which is incorporated herein by reference.

2. Description of the Related Art

Patent document 1: Japanese Patent Kokai Number 2003-4547

Patent document 2: Japanese Patent Kohyo Number 2005-533443

In the above document 1, there is a description of the temperature detecting circuit for outputting a temperature signal by comparing frequencies between the ring oscillator changing the oscillation frequency corresponding to the ambient temperature and the crystal oscillator.

Furthermore, in the above document 2, there is a description of the constant current circuit for supplying a constant current independently from the power supply voltage or the ambient temperature and the current-control type ring oscillator configured by a ring oscillator driven by the above constant current circuit in order to output a constant oscillation frequency.

It is publicly known that a frequency of ring oscillator dependents on an ambient temperature largely as described in the patent document 1, and then a oscillation frequency is stabilized by making the current supplied to the ring oscillator constant, as in the patent document 2. However, since a oscillation frequency of ring oscillator depends on not only the power supply voltage but the ambient temperature also, it is impossible to stabilize the frequency completely only by making the current constant.

SUMMARY OF THE INVENTION

The object of the present invention is to provide an oscillation circuit having small frequency variation caused by the power supply voltage and the ambient temperature.

According to one aspect of the present invention, for achieving one or more of the above objects, there is provided an oscillation circuit that includes a temperature-dependent current source being configured to output a control voltage based on a current flowing into a transistor corresponding to an ambient temperature; a first logic gate and a second logic gate being configured to output a second level of output signal when both of two input signals have a first level and to output said first level of said output signal when one or both of said two input signals have said second level, wherein the output side of said first logic gate is connected to the first input side of said second logic gate and the output side of said second logic gate is connected to the first input side of said first logic gate; a first delay circuit being configured to start charging or discharging of a capacitor corresponding to said control voltage when the output signal of said second logic gate is changed from said second level to said first level, and provide the second input side of said first logic gate with a pulse of said second level when the voltage of said capacitor reaches to a threshold voltage depending on the ambient temperature; and a second delay circuit being configured to start charging or discharging of a capacitor corresponding to said control voltage when the output signal of said first logic gate is changed from said second level to said first level, and provide the second input side of said second logic gate with a pulse of said second level when the voltage of said capacitor reaches to a threshold voltage depending on the ambient temperature.

The above and further objects and novel features of the invention will more fully appear from the following detailed description, appended claims and the accompanying drawings.

BRIEF DESCRIPTION OF THE DRAWINGS

FIG. 1 is a circuit diagram of an oscillation circuit according to the first embodiment of the present invention.

FIG. 2 is a waveform diagram showing the operation of FIG. 1.

FIG. 3 is a circuit diagram of an oscillation circuit according to the second embodiment of the present invention.

FIG. 4 is a waveform diagram showing the operation of FIG. 3.

DETAILED DESCRIPTION OF THE PREFERRED EMBODIMENTS

An oscillation circuit according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

FIG. 1 is a circuit diagram of the first embodiment of the invention.

The oscillation circuit is configured by a constant voltage source 10, a temperature-dependent current source 30, a couple of conjunction circuits 40A, 40B composing an astable multi-vibrator.

The constant voltage source 10 generates a constant voltage VDD independently from the variations of the powers supply voltage VCC and the ambient temperature T.

The above constant voltage source 10 includes a serial circuit consisting of a P-channel MOS transistor (hereinafter referred to as 'PMOS') 11 connected between the power supply voltage VCC node and the ground voltage VSS node, a resistor 12, and a diode 13. Furthermore, a serial circuit of a PMOS 14 and a diode 15 and a serial circuit of a PMOS 16, a resistor 17, and a diode 18 are connected between the power supply voltage VCC node and the ground voltage VSS node. Drains of the PMOSs 11, 14 are connected to a non-inverted input terminal and an inverted input terminal of a operational amplifier (OP) 19, respectively, and the voltage VP from the output terminal of the above operational amplifier 19 is provided the gates of the PMOSs 11, 14, 16. Furthermore, the operational amplifier 20 having a voltage-follower connection is connected to the drain of the PMOS 16 and the constant voltage VDD is outputted from the above operational amplifier 20 thereof.

The conjunction circuits 40A, 40B are driven by the constant voltage VDD from the constant voltage source 10, and have the delay function that the delay time is controlled corresponding to the voltage VN dependent on the temperature signal from the temperature-dependent current source 30.

The conjunction circuit 40A includes a PMOS 41a connected between the voltage VDD node and a node NA, and NMOSs 42a, 43a serially connected between the above node NA and a ground voltage VSS node. The gate of NMOS 42a is provided with the voltage VN by the temperature-dependent current source 30, and the gates of PMOS 41a, the NMOS 43a are provided with a output signal ZB of the conjunction circuit 40B. At the same time, a gain constant of the NMOS 43a is set to larger enough than the gain constant of the NMOS 42a in order to increase the effect of controlling current by the voltage VN. Furthermore, the gate lengths of the NMOS 42a and the NMOS 43a composing a Mirror circuit are set to the same each other.

The node NA is connected to one end of a capacitor 44a and a gate of NMOS 45a, and the other end of the capacitor 44a thereof and the source of NMOS 45a are connected to the ground voltage VSS node. The drain of NMOS 45a is connected to the voltage VDD node through a PMOS 46a having the gate fixed to the ground voltage VSS node. At the same time, the gate length of the above PMOS 46a is set to larger than the gate length of the NMOS 45a, because the PMOS 46a has a function of load device of the NMOS 45a. Therefore, the driving capability of the PMOS 46a becomes smaller than the NMOS 45a, and then a switching effect by the NMOS 45a becomes larger.

The connection point of the NMOS 45a and the PMOS 46a is connected to a inverting circuit 47a configured by inverters having stages of odd number, etc. for shaping a waveform of a signal XA and generating simultaneously an inverted signal YA. The output side of the inverting circuit 47a is connected to one of the input sides of a two-input non-conjunction gate (hereinafter referred to as 'NAND') 48a and the other input side is provided with an output signal ZB of a conjunction circuit 40B. Furthermore, the output side of the NAND 48a outputs an output signal ZA of the above conjunction circuit 40A.

A conjunction circuit 40B has the same circuit configuration as the conjunction circuit 40A and the suffixes added to circuit element numerals are changed from "a" of the conjunction circuit 40A to "b". In the above conjunction circuit 40B, gates of a PMOS 41b and a NMOS 43b are provided with the output signal ZA of the conjunction circuit 40A and one end of a capacitor 44b is connected to a node NB. At the same time, a signal XB at the connection point of the NMOS 45a and the PMOS 46a is waveform-shaped and inverted by the inverting circuit 47b, and the above inverted signal is provided one of input sides of NAND 48b as a signal YB. Furthermore, the other input side of the NAND 48b is provided with output signal ZA of the conjunction circuit 40A and the output signal ZB outputs from the output side of the above NAND 48b.

A level shift circuit 50 changes a level of, for example, the output signal ZA of the conjunction circuit 40A to a level corresponding to the power supply voltage VCC, and outputs the above level-shifted signal as a oscillation output signal OSC.

FIG. 2 is a waveform diagram showing the operation of FIG. 1. The operation of FIG. 1 will be explained referring to the above FIG. 2, as follows.

Assuming that the diode 15 size of the constant voltage source 10 is set K times (wherein K>1) large as sizes of the diodes 13, 18, and resistances of the resistors 12, 17 are R12, R17, respectively, it is noted that the voltage VDD can be approximated by the following formula.

$$VDD \approx \frac{k}{q}\left(\frac{R17}{R12}\ln K - \ln A\right)T + \frac{Eg}{q} \quad (1)$$

Wherein, k is Boltzmann constant, q is the elementary electron charge, Eg is the band gap voltage of Silicon, T is an ambient absolute temperature, and A is a proportionality constant calculated by the effective density of state and the impurity density.

Consequently, assuming that the resistances R12, R17, K, and A are set so that a coefficient of T in the formula (1) becomes zero, a constant voltage VDD (=Eg/q) independent from the power supply voltage and the ambient temperature T can be achieved.

Furthermore, a current Iptat of the NMOS 32 and a threshold voltage Vtn of the NMOS 32 in the temperature-dependent current source 30 are calculated as the following formula (2).

$$Iptat = \frac{k}{q}T\ln K \quad (2)$$

$$Vtn = Vt(O) + a(T - T0)$$

Wherein, the Vt (0) is a threshold voltage at 298K, a is a temperature coefficient of the above threshold voltage (a<0), T0=298.

The constant voltage VDD generated by the constant current source 10 are provided as a driving voltage for the conjunction circuits 40A, 40B. At the same time a voltage VN corresponding to the current Iptat of the temperature-dependent current source 30 is provided the NMOSs 42a, 42b of the conjunction circuits 40A, 40B. as a control voltage Assuming that the voltage VA of the node NA is approximately the VDD and the output signal ZB of the conjunction circuit 40B is level "H" in the astable multi-vibrator consisting of the conjunction circuits 40A, 40B, the NMOS 45a is turned on and the signals XA, YA are changed to level "L", "H", respectively, and then the output signal ZA of the conjunction circuit 40A becomes level "L", as shown at the time T0 of FIG. 2.

In the conjunction circuit 40B, the PMOS 41b is turned on, the NMOS 43b is turned off, the voltage VB of the node NB becomes the VDD. Consequently, the NMOS 45b is turned on, and signals XB, YB are level "L", "H", respectively. Therefore, the output signal ZB from the NAND 48b is changed to level "H".

Meanwhile, since the conjunction circuit 40A is provided with the output signal ZB by the conjunction circuit 40B, the PMOS 41a is turned off, the NMOS 43a is turned on. Consequently, the charge held in the capacitor 44a is discharged to the ground voltage VSS node through the NMOSs 42a, 43a by the given time constant.

At the time T1, by discharging of the capacitor 44a, the voltage VA of the node NA is changed to lower than the threshold voltage Vtn of the NMOS 45a, then the above NMOS 45a is turned off and the signal XA is changed to level "H". Consequently, after a slight delay through the inverting circuit 47a, the signal YA is changed to level "L" and the output signal ZA from the NAMD 48a is changed to level "H".

When the output signal ZA is changed to level "H", the output signal ZB from the NAND 48b of the conjunction circuit 40B becomes level "L". Consequently, the PMOS 41a is turned on and the NMOS 43a is turned off in the conjunction circuit 40A, then the capacitor 44a is rapidly charged to the voltage VDD through the PMOS 41a. By rising of the voltage VA of the node NA, the NMOS 45a is turned on again, and then the signals XA, YA are changed back to level "L", "H", respectively. However, at the above time point, since the output signal ZB of the conjunction circuit 40B is stayed at level "L", the output signal ZA is held at level "H".

Meanwhile, since the conjunction circuit 40B is provided with the output signal ZA of level "H," by the conjunction circuit 40A, the PMOS 41b is turned off and the NMOS 43b is turned on. Consequently, the charge held by the capacitor 44b is discharged to the ground voltage VSS node through the NMOSs 42b, 43b by the given time constant.

At the time T2, by discharging by the capacitor 44b, the voltage VB of the node NB falls to lower than the threshold voltage Vtn of the NMOS 45b, then the above NMOS 45b is turned off and the signal XB is changed to level "H". Consequently, after a slight delay through the inverting circuit 47b, the signal YB is changed to level "L" and the output signal ZB from the NAMD 48b is changed to level "H".

When the output signal ZB is changed to level "H", the output signal ZA from the NAND 48a of the conjunction circuit 40A becomes level "L". Consequently, the PMOS 41b is turned on and the NMOS 43b is turned off in the conjunction circuit 40B, then the capacitor 44b is rapidly charged to the voltage VDD through the PMOS 41b. By rising of the voltage VB of the node NB, the NMOS 45b is turned on again, and then the signals XB, YB are changed back to level "L", "H", respectively. However, at the above time point, since the output signal ZA of conjunction circuit 40A is stayed at level "L", the output signal ZB is held at level "H".

Meanwhile, since the conjunction circuit 40A is provided with the output signal ZB of level "H" by the conjunction circuit 40B, the PMOS 41b is turned off and the NMOS 43b is turned on. Consequently, the charge held by the capacitor 44b is discharged to the ground voltage VSS node through the NMOSs 42b, 43b by the given time constant.

By repeating the above mentioned operations, the output signal ZA having the pulse width corresponding to time constants of the integration circuits of the capacitor 44a and the NMOSs 42a, 43a in the conjunction circuit 40A, and the output signal ZB having the pulse width corresponding to time constants of the integration circuits of the capacitor 44b and the NMOSs 42b, 43b in the conjunction circuit 40B are outputted alternately.

Assuming that the time constant of the integration circuit 40A, 40B are set to the same value each other, and the capacitance of the above capacitors 44a, 44b is C, a charge Q charged in the capacitors 44a, 44b is calculated by the following formula (3).

$$Q = C(VDD - Vtn) = \int_0^t Iptat\, dt \quad (3)$$

Wherein the current Iptat does not depend on time, then the pulse width is represented by the following formula (4).

$$t = \frac{C(VDD-Vtn)}{Iptat} = \frac{C\left[\frac{Eg}{q} - \{Vt(0) - a(T-T0)\}\right]}{\frac{k}{q}T\ln K} \quad (4)$$

Consequently, by setting the circuit constants so that the coefficient of the temperature T is close to zero in the formula (4), the oscillation frequency having small variation caused by the power supply voltage VCC and the ambient temperature T can be achieved.

A qualitative explanation is as follows, referring to FIG. 2. In the case where the ambient temperature T rises, by rising of the voltage VN corresponding to the current Iptat depending on the temperature, the current flowing in the NMOSs 42a, 42b, that is, the discharge current of the capacitors 44a, 44b increases. Therefore, the falling speed of the voltages VA, VB of the nodes NA, NB increases. Meanwhile, the threshold voltage Vtn of the NMOSs 45a, 45b falls as the ambient temperature rises. Consequently, the time period t during when the voltages VA, VB fall from the constant voltage VDD to lower than the threshold voltage Vtn is not affected largely by rising of the ambient temperature T. Meanwhile, in the case where the ambient temperature T falls, the state opposite to the above mentioned state arises. Consequently, the variation caused by the ambient temperature T can be restrained.

As explained before, the oscillation circuit according to the first embodiment includes the constant current source 10 for generating the constant voltage VDD not affected by the variations of the power supply voltage VCC and the ambient temperature T, the conjunction circuits 40A, 40B driven by the constant voltage VDD generated by the above constant voltage source 10 having a delay function, and the temperature-dependent current source 30 for outputting the voltage VN depending on the ambient temperature T in order to control the delay times of the above conjunction circuits 40A, 40B. Consequently, there is an advantage that the oscillation circuit having small oscillation frequency variation caused by the power supply voltage VCC and the ambient temperature T can be achieved.

Second Preferred Embodiment

FIG. 3 is a circuit diagram of an oscillation circuit according to the second embodiment of the invention. The oscillation circuit consists of a couple of disjunction circuits 70A, 70B composing a temperature-dependent current source 60 and the astable multi-vibrator.

The temperature-dependent current source 60 generates the voltage VP corresponding to the temperature and includes a serial circuit consisting of a PMOS 61 connected between the power supply voltage VCC node and the ground voltage VSS node, a resistor 62, and a diode 63. Furthermore, a serial circuit consisting of a PMOS 64 and a diode 65 is connected between the power supply voltage VCC node and the ground voltage VSS node. The drains of PMOSs 61, 64 are connected to a non-inverted terminal and a inverted terminal of an operational amplifier 65, respectively. The voltage VP from the output terminals of the above operational amplifier 66 is provided the gates of PMOSs 61, 64 and simultaneously outputted as a control voltage of the dusjunction circuits 70A, 70B.

The disjunction circuits 70A, 70B are logic circuits having a delay function that the delay time is controlled corresponding to the temperature-dependent voltage VP dependent from the temperature-dependent current source 60.

The disjunction circuit 70A includes PMOSs 71a, 72a connected serially between the power supply voltage VCC node and the node NA, and a NMOS 73a connected between the above node Na and the ground voltage VSS. The gate of NMOS 72a is provided with the voltage VP by the temperature-dependent current source 60, and the gates of PMOSs 71a, 73a are provided with a output signal Zb of the disjunction circuit 70B. At the same time, a gain constant of the PMOS 71a is set to larger enough than the gain constant of the PMOS 72a in order to increase the effect of controlling current by the voltage VP. Furthermore, the gate lengths of the PMOS 72a and the PMOS 64 composing a Mirror circuit are set to the same each other.

The node Na is connected to one end of a capacitor 74a and a gate of NMOS 75a, and the other end of the above capacitor 74a and a source of NMOS 75a is connected to the ground voltage VSS node. The drain of NMOS 75a is connected to the power supply voltage VCC node through a PMOS 76a having the gate fixed to the ground voltage VSS node. At the same time, the PMOS 76a has a function of load device of the NMOS 75a and the gate length of the above PMOS 76a is set larger than the gate length of the NMOS 75a. Therefore, the driving capacity of PMOS 76a becomes smaller than the NMOS 75a and then the switching effect by the NMOS 75a becomes larger.

The connection point of the NMOS 75a and the PMOS 76a is connected to a inverting circuit 77a configured by inverters, etc. for shaping a waveform of signal Xa at the above connection point and generating simultaneously a inverted signal Ya. The output side of inverting circuit 77a is connected to one of input sides of two-input non-disjunction gate (hereinafter referred to as "NOR") 78a, and the other input side of the above NOR 78a is provided with the output signal Zb of the disjunction circuit 70B. Furthermore, the output signal Za of the above disjunction circuit 70A is outputted from the output terminal of the NOR 78a. At the same time, the output signal Za is outputs as an oscillation output signal OSC of the above oscillation circuit.

The disjunction circuit 70B has the same circuit configuration as the disjunction circuit 70A and the suffixes added to circuit element numerals are changed from "a" of the conjunction circuit 70A to "b". In the above disjunction circuit 70B, gates of the PMOS 71b and the NMOS 73b are provided with the output signal Za of the disjunction circuit 70A, and the output signal Zb outputs from the output terminal of the NOR 78b.

FIG. 4 is a waveform diagram showing the operation of FIG. 3. The operation of FIG. 3 will be explained referring to the above FIG. 4, as follows.

Assuming that the voltage Va of the node Na is approximately the VSS and the output signal Zb of the disjunction circuit 70B is level "L" in the astable multi-vibrator consisting of the conjunction circuits 70A, 70B, as shown at the time t0 of FIG. 4, the NMOS 75a is turned off and the signals Xa, Ya are changed to level "H", "L", respectively, and then the output signal Za of the disjunction circuit 70A becomes level "H".

In the disjunction circuit 70B, the PMOS 71b is turned off, the NMOS 73b is turned on, the voltage Vb of the node Nb becomes the voltage VSS. Consequently, the NMOS 75b is turned off, and signals Xb, Yb are level "H", "L", respectively. Therefore, the output signal Zb from the NOR 78b is changed to level "L".

Meanwhile, since the disjunction circuit 70A is provided with the output signal Zb of level "L" by the disjunction circuit 70B, the PMOS 71a is turned on and the NMOS 73a is turned off. Consequently, the capacitor 74a is charged by the power supply voltage VCC node through the PMOSs 71a, 72a by the given time constant.

At the time t1, by charging by the capacitor 74a, the voltage Va of the node Na rises to higher than the threshold voltage Vtn of the NMOS 75b, then the above NMOS 75a is turned on and the signal Xa is changed to level "L". Consequently, after a slight delay through the inverting circuit 77a, the signal Ya is changed to level "H" and the output signal Za from the NOR 78a is changed to level "L".

When the output signal Za is changed to level "L", the output signal Zb from the NOR 78b becomes level "H". Consequently, the PMOS 71a is turned off and the NMOS 73a is turned on in the disjunction circuit 70A, then the capacitor 74a is rapidly discharged to the ground voltage VSS node through the PMOS 73a. By falling of the voltage Va of the node Na, the NMOS 75a is turned off again, and then the signals Xa, Yb are changed back to level "H", "L", respectively. However, at the above time point, since the output signal Zb of the disjunction circuit 70B is stayed at level "H", the output signal Za is held at level "L".

Meanwhile, since the disjunction circuit 70B is provided with the output signal Za by the disjunction circuit 70B, the PMOS 71b is turned on, the NMOS 73b is turned off. Consequently, the charge held in the capacitor 74b is charged from the power supply voltage VCC node through the PMOSs 71b, 72b by the given time constant.

At the time t2, by charging of the capacitor 74b, the voltage Vb of the node Nb is changed to lower than the threshold voltage Vtn of the NMOS 75b, then the above NMOS 75b is turned on and the signal Xb is changed to level "L". Consequently, after a slight delay through the inverting circuit 77b, the signal Yb is changed to level "H" and the output signal Zb from the NOR 78b is changed to level "L".

When the output signal Zb is changed to level "L", the output signal Za from the NOR 78a of the disjunction circuit 70A becomes level "H". Consequently, the PMOS 41b is turned on and the NMOS 43b is turned off in the disjunction circuit 70B, then the capacitor 44b is rapidly discharged to the ground voltage VSS through the NMOS 73b. By falling of the voltage Vb of the node Nb, the NMOS 75b is turned off again, and then the signals Xb, Yb are changed back to level "H", "L", respectively. However, at the above time point, since the output signal Za of the disjunction circuit 70A is stayed at level "H", the output signal Zb is held at level "L".

Meanwhile, since the disjunction circuit 70A is provided with the output signal Zb of level "L" by the disjunction circuit 70B, the PMOS 71a is turned on and the NMOS 73a is turned off. Consequently, the capacitor 74a is charged from the power supply voltage VCC node through the NMOSs 71a, 72a by the given time constant.

By repeating the above mentioned operations, the output signal Za having the pulse width corresponding to time constants of the integration circuit of capacitor 74a and the PMOSs 71a, 72a in the disjunction circuit 70A, and the output signal Zb having the pulse width corresponding to time constants of of the integration circuit of the capacitor 74b and the PMOSs 71a, 72b in the disjunction circuit 70B are outputted alternately.

In the above configuration, in the case where the ambient temperature T rises, by rising of the voltage VP corresponding to the current depending on the temperature signal from the temperature-dependent current source 60, the current flowing in the PMOSs 72a, 72b, that is, the charge current of the capacitors 74a, 74b decreases. Therefore, the rising speed of the voltages Va, Vb of the nodes Na, Nb decreases. Meanwhile, the threshold voltage Vtn of the NMOSs 45a, 45b falls as the ambient temperature rises. Consequently, the time period t during when the voltages Va, Vb rise from the ground voltage VSS to higher than the threshold voltage Vtn is not affected by rising of the ambient temperature T. Meanwhile, in the case where the ambient temperature T falls, the state opposite to the above mentioned state arises. Therefore, the variation caused by the ambient temperature T can be restrained.

As explained before, the oscillation circuit according to the second embodiment includes the temperature-dependent current source 60 for outputting the voltage VP depending on the ambient temperature T, and the astabel multi-vibrator consisting of the disjunction circuits 70A, 70B having a delay function that the delay time is controlled by the above voltage VP. Consequently, there is an advantage that the oscillation circuit having small oscillation frequency variation caused by the ambient temperature T can be achieved.

However, the present invention does not limit to the above mentioned embodiment and various modifications are possible. Examples of the above modifications are, for example, as follows.

(a) By including the same constant voltage source 10 as in FIG. 1 instead of the temperature-dependent current source 60 of FIG. 3, and providing the disjunction circuits 70A, 70B with the power supply voltage VDD and the voltage VP by the above constant voltage source 10, the frequency variation caused by variation of the power supply voltage VCC can be further restrained.

(b) Resistors can be used instead of the PMOSs 46a, 46b of FIG. 1 or the PMOSs 76a, 76b of FIG. 3.

The present invention includes the first and the second logic gates, and the first and the second delay circuits. The output side of the first logic gate is connected to the first input side of the second logic gate and the output side of the second logic gate is connected to the first input side of the first logic gate. The first and the second delay circuits delay the output signals of the first and the second gates thereof corresponding to the control voltage and the threshold voltage depending on the ambient temperature and provide the second input sides of the first and the second logic gates with the above delayed output signals. Therefore, the temperature-dependency of the delay circuits is canceled by the changes of the control voltage and the threshold voltage, and then the temperature-dependency of the delay time becomes smaller. Consequently, there is an effect that the oscillation circuit (stable multi-vibrator) consisting of the above the logic gates and delay circuits can restrain the oscillation frequency variation caused by the power supply voltage and the ambient voltage.

While the preferred form of the present invention has been described, it is to be understood that modifications will be apparent to those skilled in the art without departing from the spirit of the invention. The scope of the invention is to be determined solely by the following claims.

What is claimed is:

1. An oscillation circuit comprising; a temperature-dependent current source being configured to output a control voltage based on a current flowing into a transistor corresponding to an ambient temperature;
    a first logic gate and a second logic gate being configured to output a second level of output signal when both of two input signals have a first level and to output said first level of said output signal when one or both of said two input signals have said second level, wherein the output side of said first logic gate is connected to the first input side of said second logic gate and the output side of said second logic gate is connected to the first input side of said first logic gate;
    a first delay circuit being configured to start charging or discharging of a capacitor corresponding to said control voltage when the output signal of said second logic gate is changed from said second level to said first level, and provide the second input side of said first logic gate with a pulse of said second level when the voltage of said capacitor reaches to a threshold voltage depending on the ambient temperature; and
    a second delay circuit being configured to start charging or discharging of a capacitor corresponding to said control voltage when the output signal of said first logic gate is changed from said second level to said first level, and provide the second input side of said second logic gate with a pulse of said second level when the voltage of said capacitor reaches to a threshold voltage depending on the ambient temperature; further comprising a constant voltage source being configured to provide said first and second logic gates and said first and second delay circuits with a given constant power supply voltage.

2. The oscillation circuit according to claim 1, wherein said first level is a high level, said second level is a low level, and said first and second logic gates are non-conjunction logic gates.

3. The oscillation circuit according to claim 2, wherein said first delay circuit including;
    a first P-channel MOS transistor being connected between a power supply voltage node and a first node and turned on/off by the output signal of said second logic gate;
    a first N-channel MOS transistor being connected between said first node and a second node and having the conductivity controlled by said control voltage;
    a second N-channel MOS transistor being connected between said second node and a ground voltage node and turned on/off by the output signal of said second logic gate;
    a capacitor being connected between said first node and the ground voltage node;
    a third N-channel MOS transistor being connected between a third node and said ground voltage node and turned on/off by the voltage of said first node;
    a load device being connected between said third node and said power supply voltage node; and
    an inverter being configured to invert the signal of said third node and provide the second input side of said first logic gate with the inverted signal thereof,
and wherein said second delay circuit including;
    a second P-channel MOS transistor being connected between said power supply voltage node and a fourth node and turned on/off by the output signal of said first logic gate;
    a fourth N-channel MOS transistor being connected between said fourth node and a fifth node and having the conductivity controlled by said control voltage;
    a fifth N-channel MOS transistor being connected between said fifth node and said ground voltage node and turned on/off by the output signal of said second logic gate;
    a capacitor being connected between said fourth node and said ground voltage node;
    a sixth N-channel MOS transistor being connected between a sixth node and said ground voltage node and turned on/off by the voltage of said fourth node;
    a load device being connected between said sixth node and said power supply voltage node; and
    an inverter being configured to invert the signal of said sixth node and provide the second input side of said second logic gate with the inverted signal thereof.

4. The oscillation circuit according to claim 1, wherein said first level is a low level, said second level is a high level, and said first and second logic gates are non-disjuncton gates.

5. The oscillation circuit according to claim 4, wherein said first delay circuit including;
    a first P-channel MOS transistor being connected between a power supply voltage node and a first node and turned on/off by the output signal of said second logic gate;

a second N-channel MOS transistor being connected between said first node and a second node and having the conductivity controlled by said control voltage;

a first N-channel MOS transistor being connected between said second node and a ground voltage node and turned on/off by the output signal of said second logic gate;

a capacitor being connected between said second node and said ground voltage node;

a second N-channel MOS transistor being connected between a third node and said ground voltage node and turned on/off by the voltage of said second node;

a load device being connected between said third node and said power supply voltage node; and an inverter being configured to invert the signal of said third node and provide the second input side of said first logic gate with the inverted signal thereof, and wherein said second delay circuit including;

a third P-channel MOS transistor being connected between a power supply voltage node and a fourth node and turned on/off by the output signal of said first logic gate;

a fourth N-channel MOS transistor being connected between said fourth node and a fifth node and having the conductivity controlled by said control voltage;

a third N-channel MOS transistor being connected between said fifth node and said ground voltage node and turned on/off by the output signal of said second logic gate;

a capacitor being connected between said fifth node and said ground voltage node;

a fourth N-channel MOS transistor being connected between a sixth node and said ground voltage node and turned on/off by the voltage of said fifth node;

a load device being connected between said sixth node and said power supply voltage node; and an inverter being configured to invert the signal of said sixth node and provide the second input side of said second logic gate with the inverted signal thereof.

* * * * *